US012610634B2

(12) United States Patent
Lim et al.

(10) Patent No.: US 12,610,634 B2
(45) Date of Patent: Apr. 21, 2026

(54) IMAGE SENSOR

(71) Applicant: SAMSUNG ELECTRONICS CO., LTD., Suwon-si (KR)

(72) Inventors: Jungwook Lim, Hwaseong-si (KR); Seojoo Kim, Suwon-si (KR); Soeun Park, Suwon-si (KR); Sunghyuck Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 707 days.

(21) Appl. No.: 17/991,258

(22) Filed: Nov. 21, 2022

(65) Prior Publication Data

US 2023/0299099 A1 Sep. 21, 2023

(30) Foreign Application Priority Data

Mar. 15, 2022 (KR) ........................ 10-2022-0032235

(51) Int. Cl.
*H10F 39/00* (2025.01)
*H10F 39/18* (2025.01)
(52) U.S. Cl.
CPC ....... *H10F 39/8023* (2025.01); *H10F 39/182* (2025.01); *H10F 39/8037* (2025.01); *H10F 39/8063* (2025.01); *H10F 39/807* (2025.01)
(58) Field of Classification Search
CPC ............... H10F 39/8023; H10F 39/182; H10F 39/8037; H10F 39/8063; H10F 39/807;
(Continued)

(56) References Cited

U.S. PATENT DOCUMENTS

| | | | |
|---|---|---|---|
| 9,648,254 B2 | 5/2017 | Darty et al. | |
| 9,887,218 B2 | 2/2018 | Ohmaru | |

(Continued)

FOREIGN PATENT DOCUMENTS

| | | | | |
|---|---|---|---|---|
| EP | 4203044 A1 * | 6/2023 | ............ | H10F 39/811 |
| KR | 10-2015-0124367 A | 11/2015 | | |
| KR | 10-2021-0010442 A | 1/2021 | | |

OTHER PUBLICATIONS

EP Communication issued Jul. 12, 2023 from the European Patent Office in EP Patent Application No. 23161804.2.
(Continued)

*Primary Examiner* — Twyler L Haskins
*Assistant Examiner* — John H Morehead, III
(74) *Attorney, Agent, or Firm* — Sughrue Mion, PLLC

(57) ABSTRACT

An image sensor is provided. The image sensor includes: a first photodiode (PD) provided in a first area; a second PD provided in a second area, wherein the second area is smaller than and adjacent to the first area; a first floating diffusion region that is provided in the first area and connected to the first PD via a first transfer transistor; a second floating diffusion region that is connected to a power source via a first reset transistor and the first floating diffusion region via a second reset transistor; a third floating diffusion region that is provided in the second area, and is connected to the second PD via the second transfer transistor and the second floating diffusion region via a first switch; and a capacitor connected between the third floating diffusion region and the power source.

20 Claims, 14 Drawing Sheets

100

(58) Field of Classification Search
CPC ................. H10F 39/18; H10F 39/8033; H10F
39/80373; H10F 39/8027; H10F 39/802;
H10F 39/803; H10F 39/811
See application file for complete search history.

(56) References Cited

U.S. PATENT DOCUMENTS

| | | | |
|---|---|---|---|
| 10,334,191 B1 | 6/2019 | Yang et al. | |
| 10,547,802 B2 | 1/2020 | Sakakibara et al. | |
| 10,707,248 B2 | 7/2020 | Shishido et al. | |
| 10,714,517 B2 | 7/2020 | Lee et al. | |
| 10,916,587 B2 | 2/2021 | Lee et al. | |
| 11,172,155 B2 | 11/2021 | Tamaki | |
| 11,330,211 B2 * | 5/2022 | Mehta .................. | H04N 25/707 |
| 2019/0288021 A1 | 9/2019 | Koyanagi et al. | |
| 2020/0137325 A1 | 4/2020 | Mori et al. | |
| 2021/0136310 A1 * | 5/2021 | Uchida ............. | H10F 39/80373 |
| 2022/0052084 A1 * | 2/2022 | Jang ...................... | H10F 39/807 |
| 2022/0059588 A1 * | 2/2022 | Lee .................... | H10F 39/80377 |
| 2022/0149088 A1 * | 5/2022 | Im ......................... | H10F 39/807 |
| 2022/0272289 A1 * | 8/2022 | Oh ......................... | H04N 25/78 |
| 2022/0408039 A1 * | 12/2022 | Park ................... | H10F 39/8037 |

OTHER PUBLICATIONS

Communication issued on Oct. 22, 2025 by the Korean Intellectual
Property Office in Korean Patent Application No. 10-2022-
0032235.

* cited by examiner

<u>1</u>

<u>100d</u>

IMAGE SENSOR

CROSS-REFERENCE TO RELATED APPLICATION

This application claims priority under 35 U.S.C. § 119 to Korean Patent Application No. 10-2022-0032235, filed on Mar. 15, 2022, in the Korean Intellectual Property Office, the disclosure of which is incorporated by reference herein in its entirety.

BACKGROUND

The present disclosure relates to an image sensor, and in particular, to an image sensor having a split photodiode (PD) structure.

An image sensor is a semiconductor-based sensor configured to generate electric signals based on light, and may include a pixel array having a plurality of pixels, a circuit for driving the pixel array and generating an image, etc. The image sensor may include a PD which generates charges in response to external light, a pixel circuit which converts the charges generated by the photodiode into an electric signal, etc. An image sensor may be widely applied to various devices, including a smartphone, a tablet personal computer (PC), a laptop computer, a television, a vehicle, etc., as well as a camera for capturing images or videos. Recently, along with research for improving a dynamic range of an image sensor, research for exactly sensing light from a light source inducing a flickering effect has been actively conducted.

SUMMARY

The present disclosure provides an image sensor having high dynamic range (HDR) and improved dark signal non-uniformity (DSNU).

It will be appreciated by one of ordinary skill in the art that that the objectives and effects that could be achieved with the inventive concept are not limited to what has been particularly described above and other objectives of the inventive concept will be more clearly understood from the following detailed description.

According to an example embodiment, an image sensor includes: a first PD provided in a first area; a second PD provided in a second area, wherein the second area is smaller than the first area, and the second area is adjacent to the first area; a first floating diffusion region that is provided in the first area and connected to the first PD via a first transfer transistor; a second floating diffusion region that is connected to a power source via a first reset transistor and the first floating diffusion region via a second reset transistor; a third floating diffusion region that is provided in the second area, and is connected to the second PD via the second transfer transistor and the second floating diffusion region via a first switch; and a capacitor connected between the third floating diffusion region and the power source. The first PD and the second PD form one pixel, and the first switch is provided in the second area.

According to an example embodiment, an image sensor includes: a substrate having a first area and a second area; a first PD provided in the first area of the substrate; a second PD that is smaller than the first PD, and is provided in the second area of the substrate; a first floating diffusion region that is provided on an upper portion of the first PD and is connected to the first PD via a first transfer transistor; second floating diffusion regions that are provided on the upper portion of the first PD in the first area and an upper portion of the second PD in the second area, and connected to a power source via a first reset transistor and the first floating diffusion region via a second reset transistor; a third floating diffusion region which is provided on the upper portion of the second PD, and connected to the second PD via a second transfer transistor and the second floating diffusion regions via a first switch; a capacitor provided on the upper portion of the second PD, and connected between the third floating diffusion region and the power source; and a color filter and a micro-lens that are provided on lower portions of the first area and the second area. A deep trench isolation (DTI) extends through the substrate between the first area and the second area, the first PD and the second PD form one pixel, and the first switch is provided between the second floating diffusion regions and the third floating diffusion region.

According to an example embodiment, an image sensor includes: a first PD provided in a first area; a second PD provided in a second area that is smaller than the first area and is adjacent to the first area; a first floating diffusion region provided in the first area; a second floating diffusion region provided in each of the first area and the second area; a third floating diffusion region provided in the second area; a first transfer transistor provided between the first PD and the first floating diffusion region; a second transfer transistor provided between the second PD and the third floating diffusion region; a first reset transistor provided between the second floating diffusion region and a power source; a second reset transistor provided between the first floating diffusion region and the second floating diffusion region; a first switch provided between the third floating diffusion region and the second floating diffusion region in the second area; and a capacitor provided between the third floating diffusion region and the power source in the second area. The first PD and the second PD form one pixel, and a DTI extends between the first area and the second area.

BRIEF DESCRIPTION OF THE DRAWINGS

The above and other aspects and features will be more clearly understood from the following description, taken in conjunction with the accompanying drawings, in which.

DETAILED DESCRIPTION

Figure 1:
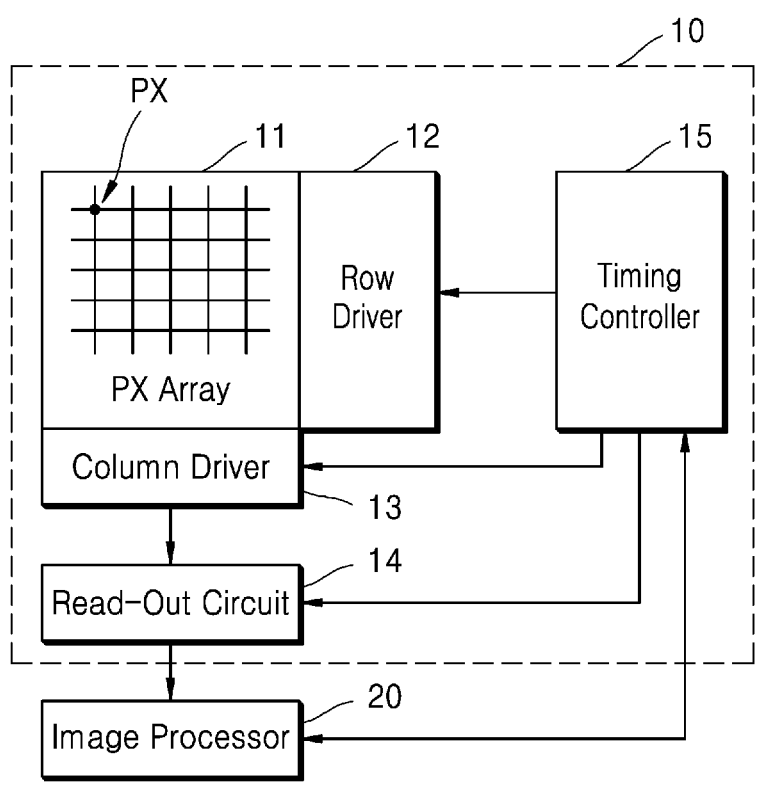
FIG. 1 is a block diagram schematically showing an image processing apparatus including an image sensor according to an example embodiment.

Hereinafter, example embodiments are described in conjunction with the accompanying drawings. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Like reference numerals denote the same elements on the drawings, and detailed descriptions thereof are omitted.

FIG. 1 is a block diagram schematically showing an image processing apparatus including an image sensor according to an example embodiment.

Referring to FIG. 1, an image processing apparatus 1 according to an example embodiment may include an image sensor 10 and an image processor 20. The image sensor 10 may include a pixel array 11, a row driver 12, a column driver 13, a read-out circuit 14, and a timing controller 15, etc.

The image sensor 10 may operate according to a control command received from the image processor 20, and may convert light reflected or emitted from an object, that is, a target to be photographed, into an electric signal and output the electric signal to the image processor 20. The pixel array 11 included in the image sensor 10 may include a plurality of pixels PX, and each of the plurality of pixels PX may include a photodiode (PD) that receives light and generates charges. In an example embodiment, each of the plurality of pixels PX may include two or more PDs.

In addition, each of the plurality of pixels PX may include a pixel circuit for generating an electric signal from the charge generated by the PDs. For example, the pixel circuit may include pixel transistors, such as a transfer transistor, a driving transistor, a select transistor, a reset transistor, etc. When one pixel PX includes two or more PDs, each pixel PX may include pixel circuits for processing charges generated respectively by the two or more PDs. That is, when one pixel PX includes two or more PDs, the pixel circuit may include two or more of at least one of the transfer transistor, the driving transistor, the select transistor, and the reset transistor.

In the image processing apparatus 1 according to an example embodiment, one pixel PX may include a first PD and a second PD. Accordingly, the pixel PX may have a split PD structure. Also, in the image processing apparatus 1 according to an example embodiment, one pixel PX may include a first pixel circuit for processing charges generated by the first PD and a second pixel circuit for processing charges generated by the second PD. The first pixel circuit and the second pixel circuit may each include a plurality of semiconductor devices. The first pixel circuit may generate and output a first pixel signal from the charges generated by the first PD, and the second pixel circuit may generate and output a second pixel signal from the charges generated by the second PD. The first pixel signal and the second pixel signal may each include a reset voltage and a pixel voltage.

The row driver 12 may drive the pixel array 11 in units of rows. For example, the row driver 12 may generate a transfer control signal configured to control the transfer transistor, a reset control signal configured to control the reset transistor, a select control signal configured to control the select transistor, etc. of each pixel PX.

The column driver 13 may include a correlated double sampler (CDS), an analog-to-digital converter (ADC), etc. The CDS may perform a correlated double sampling for obtaining pixel signals through column lines connected to the pixels PX that are included in a row selected by a row select signal supplied from the row driver 12. The ADC may convert an output from the CDS into a digital signal and transfer the digital signal to the read-out circuit 14.

The read-out circuit 14 may include a latch or a buffer circuit capable of temporarily storing the digital signal, an amplification circuit, etc. Also, the read-out circuit 14 may process the digital signal received from the column driver 13 and generate image data. Operation timings of the row driver 12, the column driver 13, and the read-out circuit 14 may be determined by the timing controller 15. The timing controller 15 may be operated by a control command transferred from the image processor 20. The image processor 20 may signal-process the image data output from the read-out circuit 14, and may output the signal-processed data to the display apparatus, etc. or may store the signal-processed data in a storage device, such as a memory. Also, when the image processing apparatus 1 of an example embodiment is installed in an autonomous vehicle, the image processor 20 may signal-process the image data into a signal and then transfer the signal-processed data to a main controller, etc. controlling the autonomous vehicle.

Figure 2:
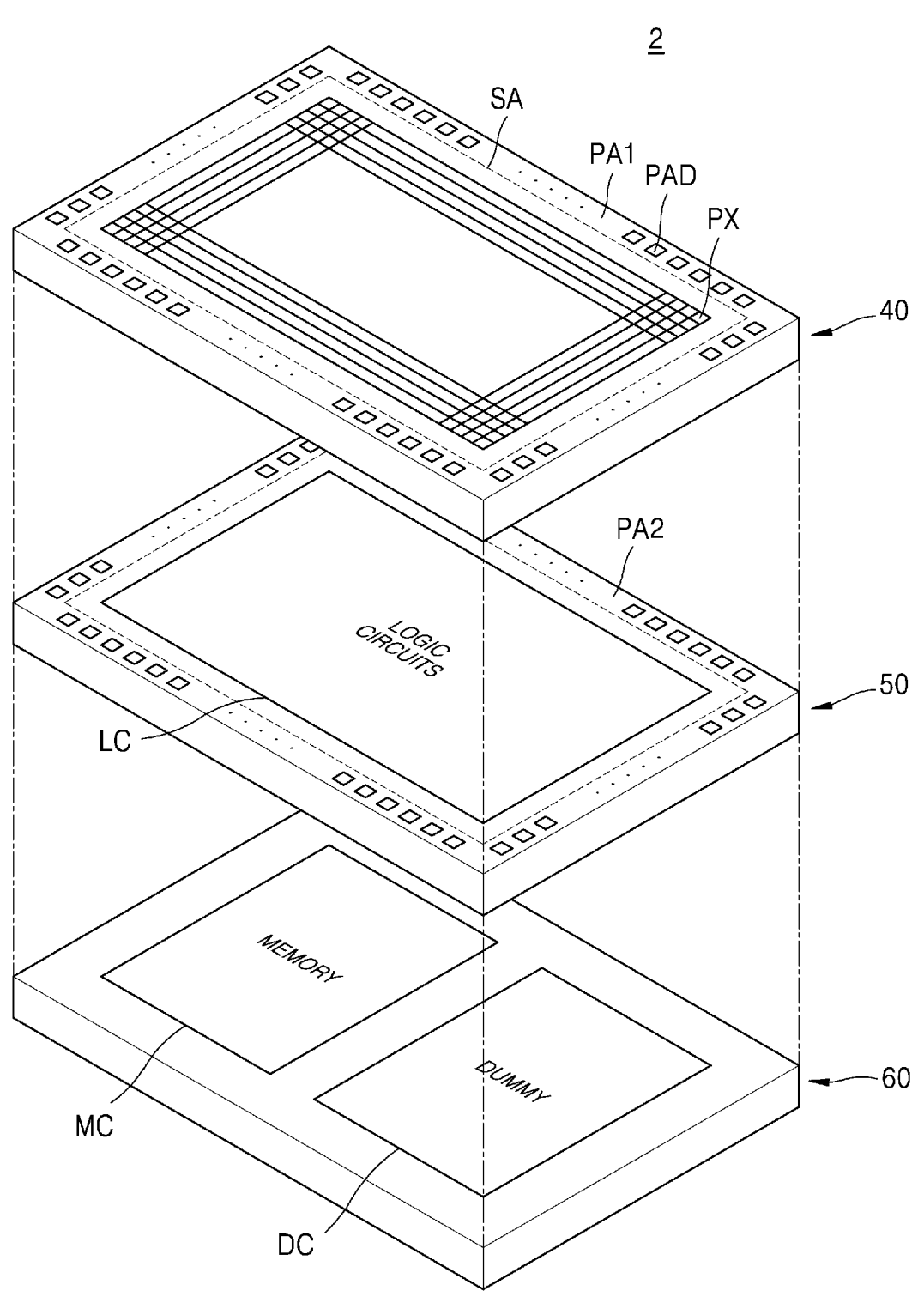
FIGS. 2 and 3 are perspective views schematically showing an image processing apparatus including an image sensor according to one or more example embodiments.
Figure 3:
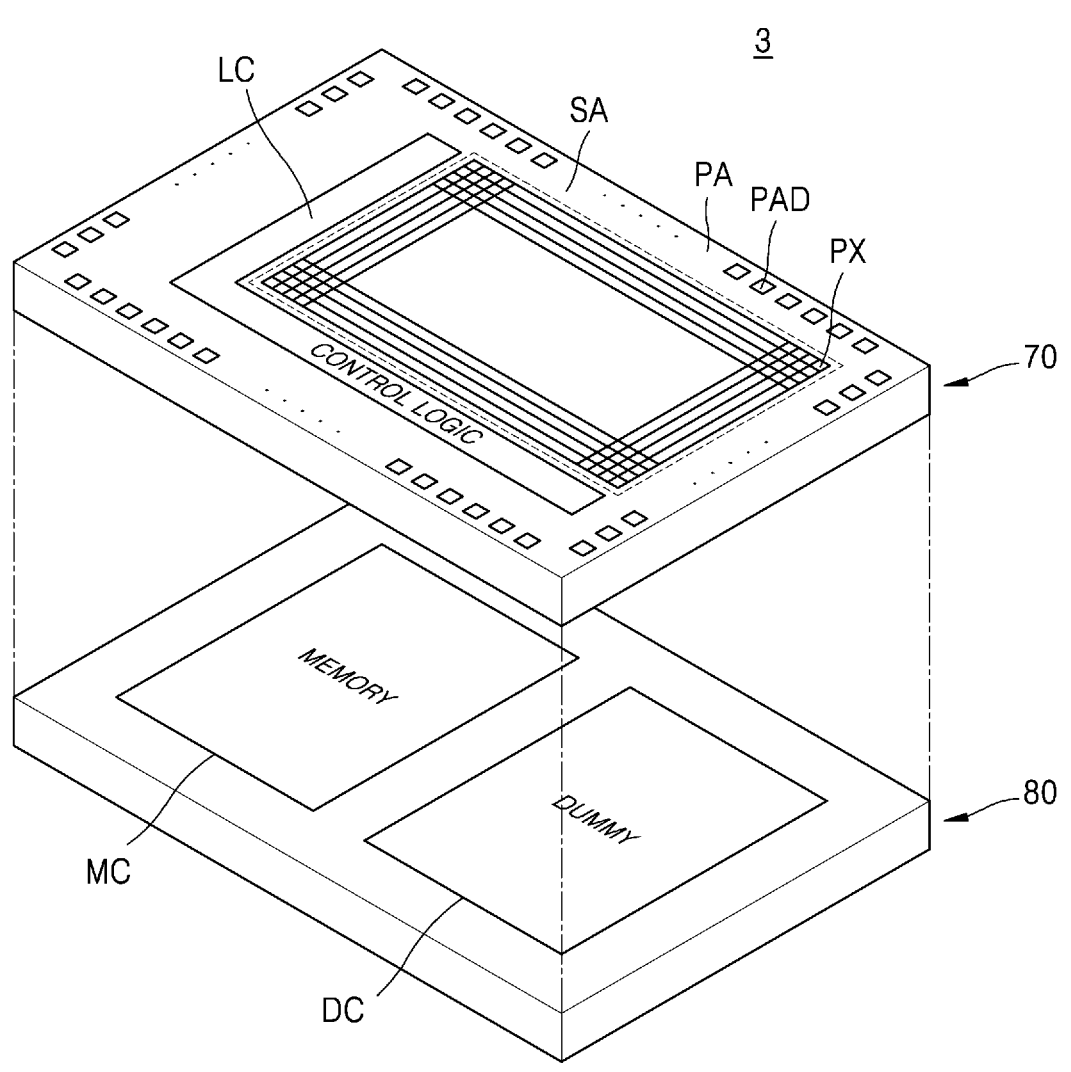

FIGS. 2 and 3 are perspective views schematically showing image processing apparatuses including an image sensor according to example embodiments.

Referring to FIG. 2, the image processing apparatus 2 of an example embodiment may include a plurality of chips that are laminated. For example, the image processing apparatus 2 may include an upper chip 40 having a pixel array area or a sensing area SA, an intermediate chip 50 having a logic circuit area LC, and a lower chip 60 having a memory area MC and a dummy area DC. In some example embodiments, the upper chip 40 and the intermediate chip 50 are laminated at a wafer level, and the lower chip 60 may be attached to the lower portion of the intermediate chip 50 at a chip level.

The upper chip 40 may include the sensing area SA in which a plurality of pixels PX are arranged, and a first pad area PA1 around the sensing area SA. A plurality of upper pads PAD may be arranged in the first pad area PA1. The plurality of upper pads PAD may be respectively connected to pads arranged in a second pad area PA2 of the intermediate chip 50 through vias, etc. and may be respectively connected to logic circuits of the logic circuit area LC.

Each of the plurality of pixels PX may include a PD which receives the light and generates charges, and a pixel circuit which converts the charges generated by the PD into electric signals, etc. The PD may include an organic PD, a semiconductor PD, etc. In some example embodiments, the plurality of pixels PX may each include a plurality of semiconductor PDs. The pixel circuit may include a plurality of pixel transistors for converting the charges generated by the PD into the electric signals.

The intermediate chip 50 may include the logic circuit area LC in which the logic circuits are arranged, and the second pad area PA2 around the logic circuit area LC. The logic circuits of the logic circuit area LC may include circuits for driving pixel circuits arranged on the upper chip 40, for example, a row driver, a column driver, a timing controller, etc. The logic circuits of the logic circuit area LC may be respectively connected to the pixel circuits via the pads in the first and second pad areas PA1 and PA2, and the vias.

The lower chip 60 may include the memory area MC and the dummy area DC. In some example embodiments, the dummy area DC may be omitted. Also, in some example embodiments, the lower chip 60 may have a package structure. For example, the memory area MC and the dummy area DC are each manufactured as a chip and then sealed together with a sealing material, and thus, the lower chip 60 may have a package structure including two chips. In the memory area MC, memory devices, such as dynamic random-access memory (DRAM) devices, static RAM (SRAM) devices, etc., may be arranged. However, the memory devices in the memory area MC may not be limited to DRAM devices or SRAM devices. The memory devices may not be arranged in the dummy area DC. The dummy area DC may have a function of supporting upper chips 40 and 50, not the function of storing data. The memory devices of the memory area MC may be electrically connected to at least some of the logic circuits in the logic circuit area LC of the intermediate chip 50 via bumps, through-electrodes, etc.

Referring to FIG. 3, an image sensor 3 of an example embodiment may include an upper chip 70 and a lower chip 80. The upper chip 70 may include the sensing area SA in which the plurality of pixels PX are provided, the logic circuit area LC in which devices for driving the plurality of pixels PX are provided, and a pad area PA around the sensing area SA and the logic circuit area LC. A plurality of upper pads PAD are arranged in the pad area PA and may be connected respectively to memory devices of the memory area MC in the lower chip 80 through the vias, etc. The lower chip 80 may include the memory area MC and the dummy area DC. The lower chip 80 may be substantially the same as the lower chip 60 in the image processing apparatus 2 of FIG. 2. Accordingly, detailed descriptions about the lower chip 80 are omitted.

Figure 4:
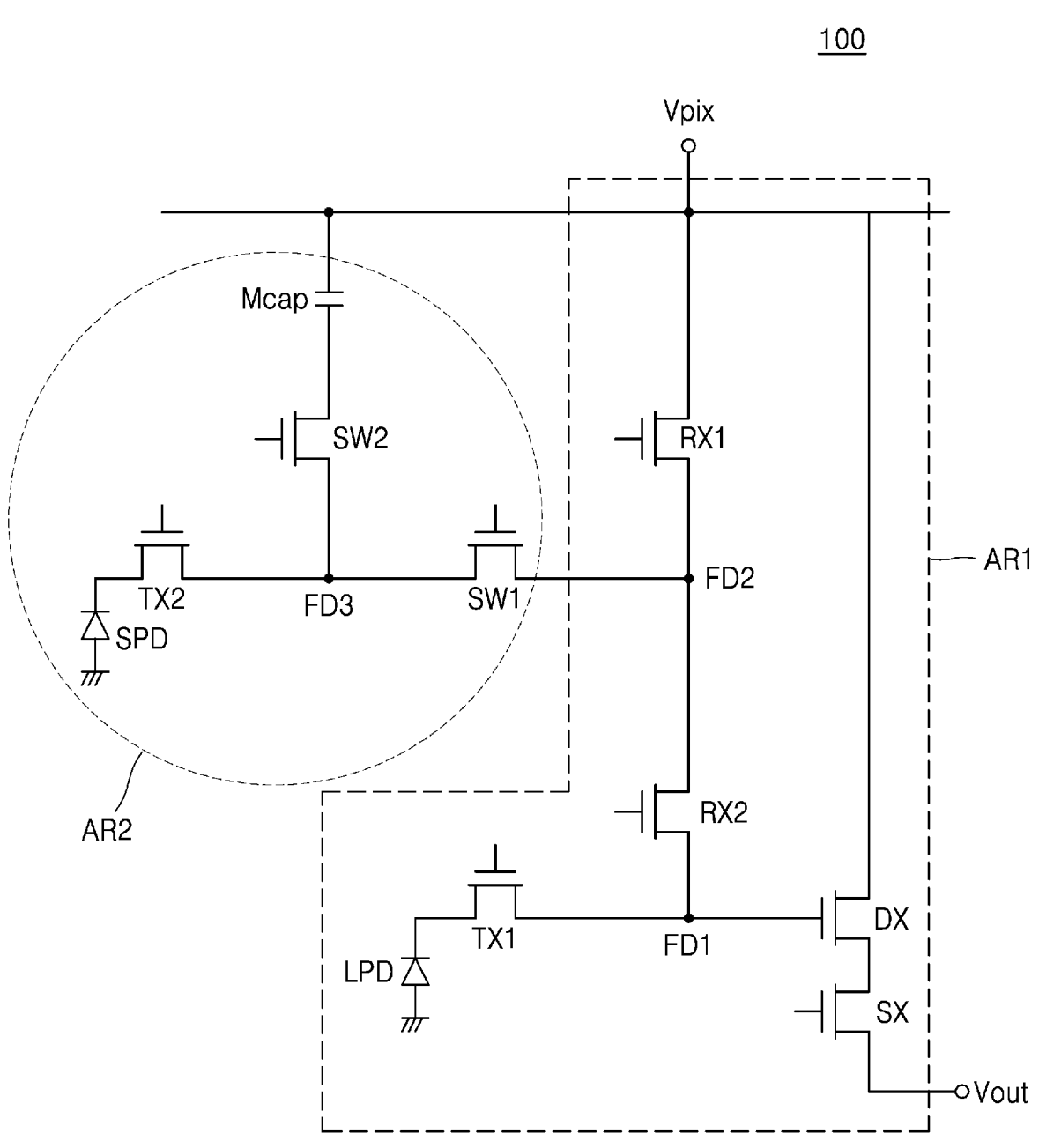
FIG. 4 is a circuit diagram of a pixel circuit included in an image sensor according to an example embodiment.
Figure 5A:
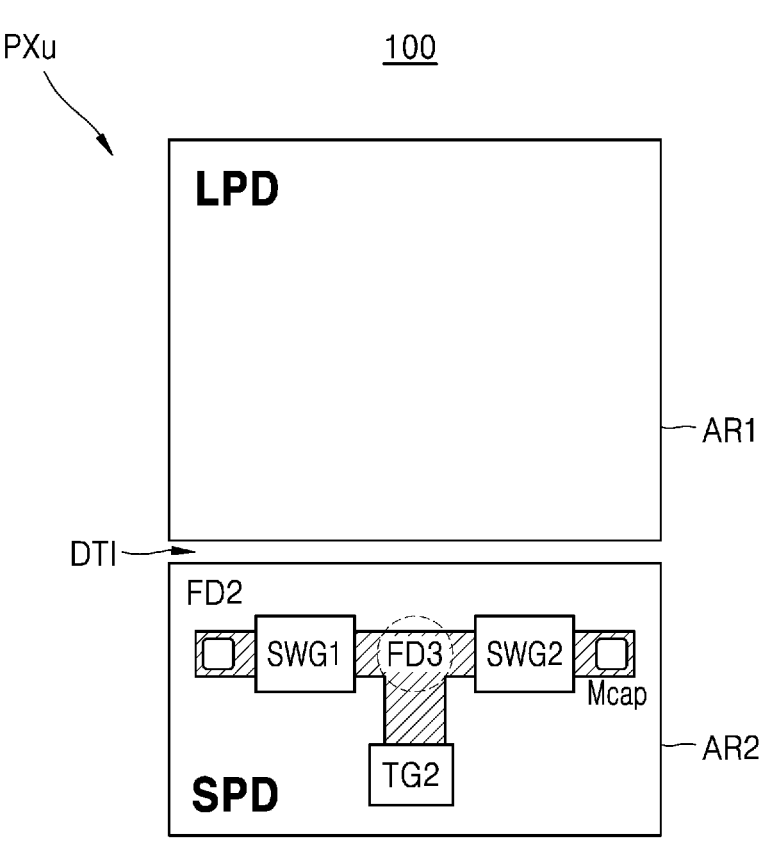
FIG. 5A is a conceptual diagram showing a structure of a pixel circuit arranged in a second photodiode (PD) area according to an example embodiment.
Figure 5B:
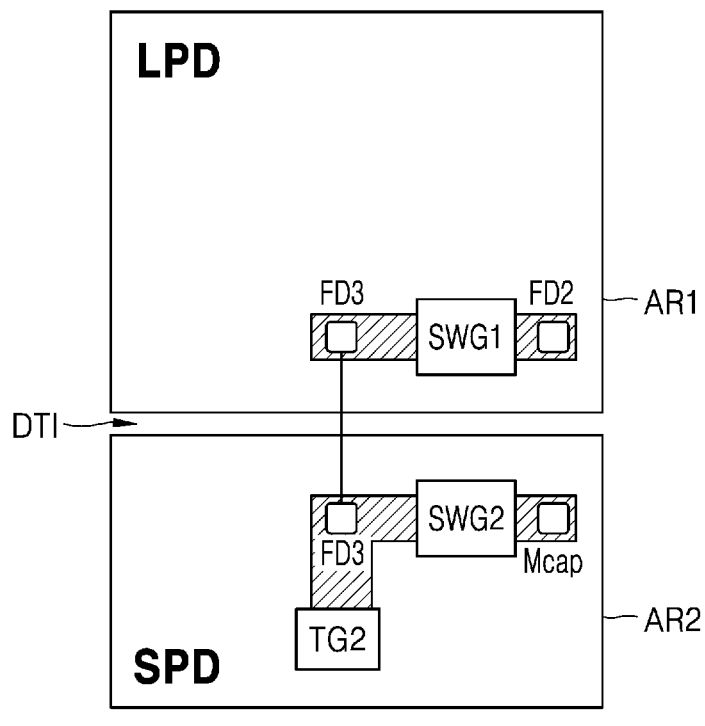
FIG. 5B is structure of a of pixel circuit according to a comparative example.

FIG. 4 is a circuit diagram showing a pixel circuit included in the image sensor according to an example embodiment, and FIG. 5A is a conceptual diagram showing a basic structure of a pixel circuit arranged in a second PD area, according to an example embodiment, and FIG. 5B is a conceptual diagram showing a basic structure of a pixel circuit according to a comparative example.

Figure 10:
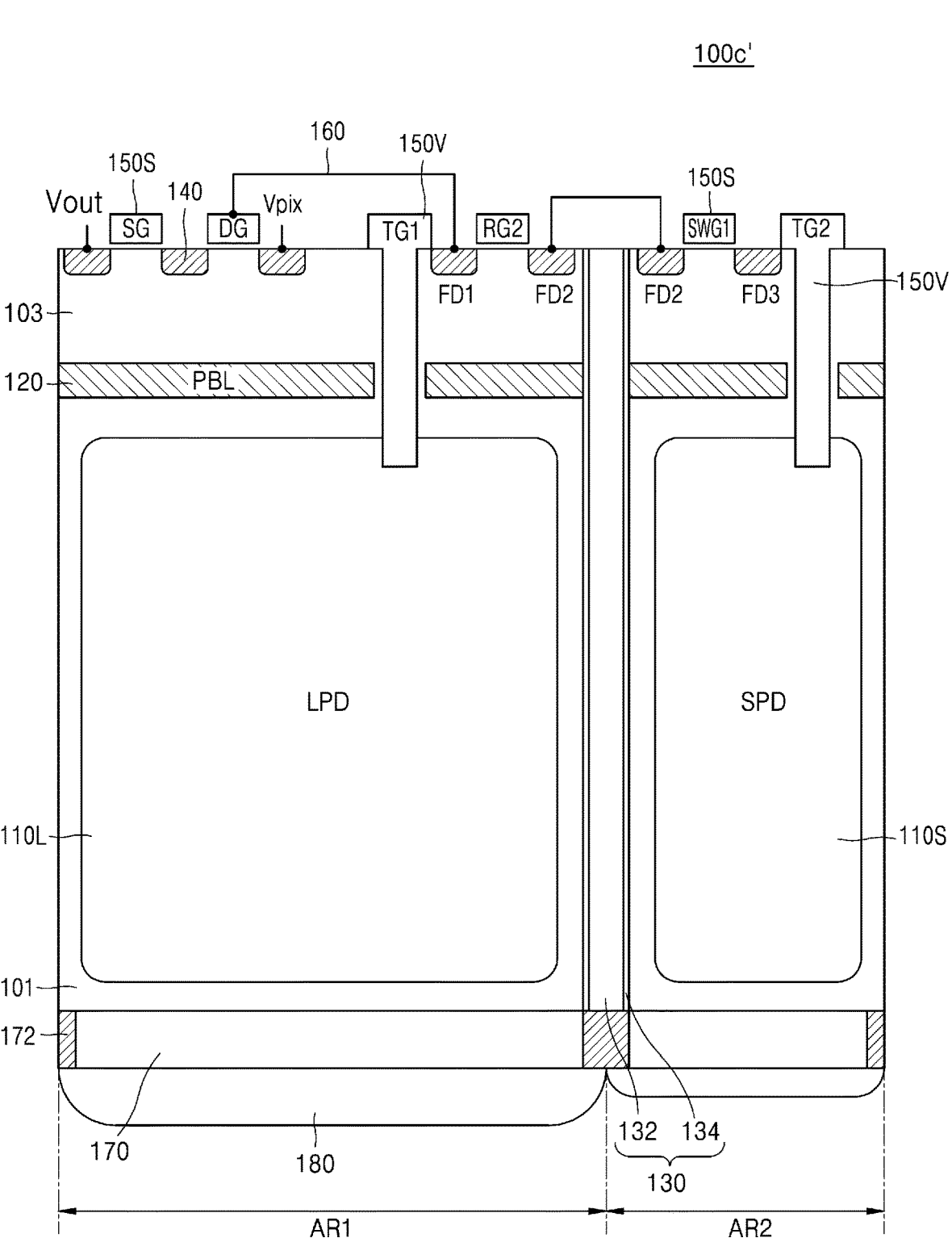
FIG. 10 is a cross-sectional view taken along line I-I' of FIG. 9B according to an example embodiment.

Referring to FIGS. 4 to 5B, an image sensor 100 according to an example embodiment may include a first PD area AR1 and a second PD area AR2. As shown in FIG. 10, in the first PD area AR1, a large PD (LPD) may be arranged on a substrate 101, and in the second PD area AR2, a small PD (SPD) may be arranged on the substrate 101. The first PD area AR1 may output an electric signal by using charges generated by the LPD. Also, the second PD area AR2 may output an electric signal by using charges generated by the SPD. The LPD may have a size, for example, tens to hundreds of times greater than the SPD. Here, the size may denote a horizontal area. Accordingly, as shown in FIG. 5A and FIGS. 7A to 8, the LPD may have a light-receiving area that is tens to hundreds of times greater than the SPD.

The pixel circuit in the first PD area AR1 may include a first transfer transistor TX1, a first reset transistor RX1, a second reset transistor RX2, a driving transistor DX, and a select transistor SX. The LPD may be connected to a first floating diffusion region FD1 via the first transfer transistor TX1. The first transfer transistor TX1 may transfer charges accumulated in the LPD to the first floating diffusion region FD1, based on a transfer control signal transferred from the row driver. The LPD may generate electrons as main charge carriers.

In the image sensor 100 of an example embodiment, the first PD area AR1 may adjust a conversion gain of the charges generated by the LPD or pixel capacity by using the second reset transistor RX2 and the second floating diffusion region FD2. For example, the second reset transistor RX2 may be turned on to combine the first floating diffusion region FD1 and the second floating diffusion region FD2, and thus, the pixel capacity and a dynamic range dynamic range may be increased, and the conversion gain may be changed. That is, in the image sensor 100 of an example embodiment, the first PD area AR1 may have a double conversion gain (DCG) structure.

The driving transistor DX may operate as a source follower buffer amplifier due to the charges accumulated in the first floating diffusion region FD1. The driving transistor DX may amplify the charges accumulated in the first floating diffusion region FD1 and transfer the charges to the select transistor SX. The select transistor SX is operated according to a select control signal input by the row driver, and may perform switching and addressing operations. When the select control signal is applied from the row driver to a gate of the select transistor SX, a voltage Vout may be output through a column line connected to the select transistor SX. The voltage Vout may be detected by the column driver and the read-out circuit connected to the column line.

The column driver and the read-out circuit may detect a reset voltage while the charges are not accumulated in the first floating diffusion region FD1, and may detect a pixel voltage while the charges are accumulated in the first floating diffusion region FD1. In the image sensor 100 of an example embodiment, the CDS may generate image data by calculating a difference between the reset voltage and the pixel voltage.

The pixel circuit of the second PD area AR2 may include a second transfer transistor TX2, a first switch SW1, a second switch SW2, and a metal capacitor Mcap. The first switch SW1 and the second switch SW2 may be implemented as transistors. In some example embodiments, the second switch SW2 may be omitted. The SPD may be connected to a third floating diffusion region FD3 via the second transfer transistor TX2. The second transfer transistor TX2 may transfer the charges accumulated in the SPD to a third floating diffusion region FD3, based on the transfer control signal transferred from the row driver. The SPD may generate electrons as main charge carriers.

The charges generated by the SPD may be moved to the third floating diffusion region FD3 when the second transfer transistor TX2 is turned on. The SPD may generate charges in response to light while the second transfer transistor TX2 is turned off, and the charges generated by the SPD may be moved to and accumulated in the third floating diffusion region FD3 whenever the second transfer transistor TX2 is turned on.

Also, the charges generated by the SPD may be stored in the metal capacitor Mcap. The second switch SW2 may be disposed between the metal capacitor Mcap and the third floating diffusion region FD3. Accordingly, the metal capacitor Mcap may store the charges in response to the amount of charges generated by the SPD, operation of the second transfer transistor TX2, and operation of the second switch SW2. In an example embodiment, the second switch SW2 may be omitted, and the charges may be stored in the metal capacitor Mcap in response to the charge amount generated by the SPD and the operation of the second transfer transistor TX2.

In addition, the first switch SW1 and the second switch SW2 may be arranged between the metal capacitor Mcap and the second floating diffusion region FD2. Accordingly, the charges in the metal capacitor Mcap may be moved to the second floating diffusion region FD2 according to turning-on/off operations of the first switch SW1 and the second switch SW2. As described above, the SPD has a relatively small light-receiving area as compared with the LPD, and may be easily saturated faster. Accordingly, as shown in FIG. 4, the charges in the SPD are moved to and stored in the metal capacitor Mcap, and in this regard, the saturation of the SPD may be prevented.

As shown in FIG. 4, the LPD and the SPD may share the column line, throughout which the voltage Vout is output. Accordingly, while the first pixel voltage corresponding to the charge of the LPD is output through the column line, the SPD may be separated from the column line. For example, while the first pixel voltage is output through the column line, at least one of the second transfer transistor TX2 and the first switch SW1 may be turned off to separate the SPD from the column line. In order to generate the first pixel voltage and output the first pixel voltage through the column line by using the charges of the LPD, the first transfer transistor TX1 may be turned on and the charges generated by the LPD may be accumulated in the first floating diffusion region FD1.

Likewise, while the second pixel voltage corresponding to the charges of the SPD is output through the column line, the LPD may be separated from the column line. For example, while the second pixel voltage is output through the column line, the first transfer transistor TX1 may be turned off to separate the LPD from the column line. In order to generate the second pixel voltage and output the second pixel voltage through the column line by using the charges of the SPD, the second transfer transistor TX2, the first switch SW1, and the second reset transistor RX2 may be turned on so that the first floating diffusion region FD1, the second floating diffusion region FD2, and the third floating diffusion region FD3 may be connected to one another. The charges of the SPD may accumulate in the first floating diffusion region FD1, the second floating diffusion region FD2, and the third floating diffusion region FD3 and be converted into a voltage by the driving transistor DX.

In the image sensor 100 of an example embodiment, the SPD may be used to sense an external light source inducing a flickering effect. For example, an image that exactly represents the external light source, such as an LED which is inducing the flickering effect, may be generated by using the charges generated by the SPD, and the charges generated by the LPD may be used to generate general images.

Also, in the image sensor 100 of an example embodiment, the SPD may be used to improve the dynamic range of the image sensor. That is, the dynamic range and image quality of the image sensor may be improved by adjusting an exposure time for receiving light in each of the LPD and the SPD. For example, in order to improve the dynamic range of the image sensor, the second pixel voltage generated from the charges of the SPD may be output only once while the first pixel voltage generated from the charges of the LPD is output a plurality of times, by using a long effective integration time (EIT) signal of about 15 ms.

Figure 9A:
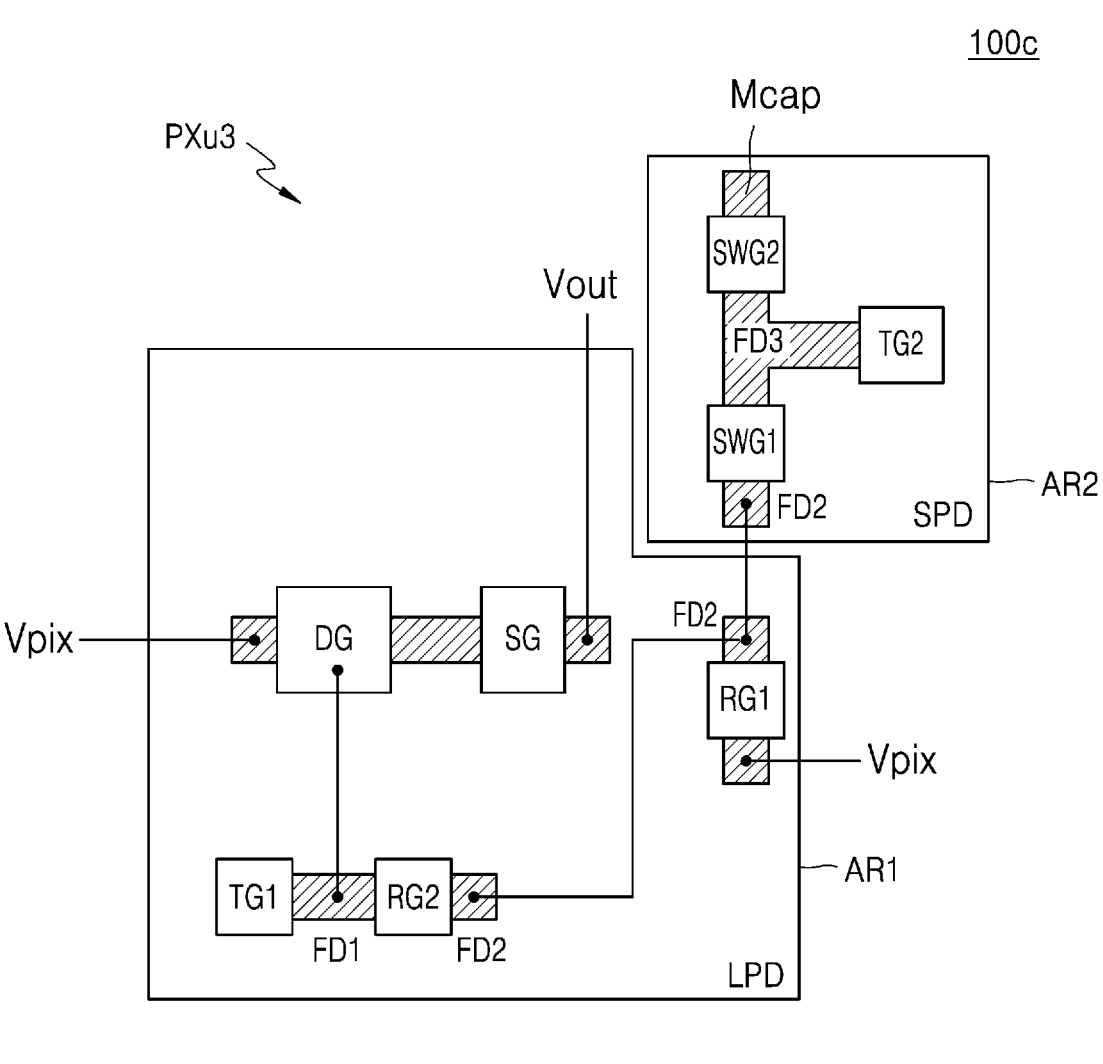
FIGS. 9A and 9B are plan views showing positions of transistors, floating diffusion regions, and switches in a unit pixel according to one or more example embodiments.
Figure 9A:
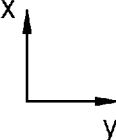

In the image sensor 100 of an example embodiment, as shown in FIG. 5A, the third floating diffusion region FD3 may be arranged only in the second PD area AR2. Accordingly, the first switch SW1 and the second switch SW2 may be arranged in the second PD area AR2, and a metal contact may not be arranged in the third floating diffusion region FD3. As described above, the second switch SW2 connecting the third floating diffusion region FD3 to the metal capacitor Mcap may be omitted. As shown in FIGS. 9A to 10, the second floating diffusion regions FD2 may be arranged respectively in the first PD area AR1 and the second PD area AR2 and may be connected to each other via the metal contact.

In the image sensor 100 of an example embodiment, because the metal contact is not provided in the third floating diffusion region FD3, a dark signal non-uniformity (DSNU) may be largely improved. Here, the DSNU denotes that different pixel values are output in dark conditions without light, that is, a condition that the light is not incident to the sensor, and may be also referred to as a white pixel. The DSNU may be basically caused by a leakage current. The leakage current may be caused by the metal contact that connects two PDs to each other, and the leakage current increases as the EIT increases.

For reference, in the image sensor having a split PD structure according to a comparative example, most of pixel transistors and switches may be arranged in the first PD area AR1 having a large area, in which the LPD is arranged. For example, as shown in the image sensor according to the comparative example shown in FIG. 5B, the third floating diffusion regions FD3 are respectively arranged in the first PD area AR1 of the LPD and the second PD area AR2 of the SPD, and the metal contact is arranged on a node of each of the third floating diffusion regions FD3 in order to connect the third floating diffusion regions FD3 in the first PD area AR1 and the second PD area AR2 to each other. Also, the first switch SW1 connecting the third floating diffusion region FD3 to the second floating diffusion region FD2 may be arranged in the first PD area AR1.

In FIGS. 5A and 5B, TG2 denotes a gate of the second transfer transistor TX2, and SWG1 and SWG2 may respectively denote gates of the first switch SW1 and the second switch SW2. Also, in the first PD area AR1 and the second PD area AR2, hatched portions denote high-concentration doping regions, which may configure the second floating diffusion region FD2, the third floating diffusion region FD3, or source/drain regions of the pixel transistor. In addition, in each of the second floating diffusion region FD2, the third floating diffusion region FD3, and the metal capacitor Mcap, a portion indicated as a square may correspond to the metal contact.

In the image sensor according to the comparative example, the leakage current occurs in the metal contact of the third floating diffusion region FD3 for the long EIT period, and the DSNU of the SPD may deteriorate and the SNR may decrease. This is because in the split PD structure for obtaining the HDR characteristics, a plurality of read-outs are performed, and the signal stored in the metal capacitor Mcap is read out through the third floating diffusion region FD3. Here, if a signal overflow type is used, a CDS operation may not performed. Consequently, noise caused by the leakage current occurring in the third floating diffusion region FD3 may not be removed, and thus, the DSNU and the SNR characteristics degrade as the temperature rises.

In the HDR image, a long exposure-time image and a short exposure-time image are captured respectively and then combined, so that a bright region may become brighter and a dark region may become darker to expand the brightness range. On the contrary, a wide dynamic range (WDR) is a technique of improving image quality in the bright region and the dark region by combining a high-speed shutter image of the bright region and a low-speed shutter image of the dark region into one image.

In the image sensor 100 according to an example embodiment, the third floating diffusion region FD3 may be arranged only in the second PD area AR2 of the SPD having a smaller area, and the first switch SW1 and the second switch SW2 may be arranged in the second PD area AR2, as shown in FIG. 5A. FIG. 5A shows a planar shape of a unit pixel PXu that is one of the pixels PX (see FIG. 1) included in the image sensor 100 of an example embodiment, and in particular, shows a planar arrangement structure of the pixel circuits in the second PD area AR2 that is a core of the image sensor 100 of an example embodiment.

In detail, in the image sensor 100 of an example embodiment, the unit pixel PXu may include the first PD area AR1, in which the LPD is arranged, and the second PD area AR2, in which the SPD is arranged. Also, the first PD area AR1 and the second PD area AR2 may each have a substantially rectangular shape, and may be isolated from each other by a deep trench isolation (DTI) structure. The DTI structure may be classified as a front DTI (FDTI) structure formed from the front side of the substrate and a back DTI (BDTI) structure formed from the back side of the substrate. In an image sensor 100 of an example embodiment, the first PD area AR1 and the second PD area AR2 may be isolated from each other by the FDTI structure. The DTI structure will be described in detail later with reference to FIG. 10.

In the second PD area AR2, the second transfer transistor TX2, the first switch SW1, the second switch SW2, the second floating diffusion region FD2, the third floating diffusion region FD3, and the metal capacitor Mcap may be arranged. In the image sensor 100 of an example embodiment, the third floating diffusion region FD3 is arranged only in the second PD area AR2, and accordingly, the first switch SW1 is arranged in the second PD area AR2, and an additional metal contact may not be formed on the third floating diffusion region FD3. In the second PD area AR2, the entire structure of the pixel circuits may have a T-shape about the third floating diffusion region FD3. In detail, the second floating diffusion region FD2, the first switch SW1, the third floating diffusion region FD3, the second switch SW2, and the metal capacitor Mcap are arranged in a first direction (X-direction), and form a head portion in the T-shape. Also, the second transfer transistor TX2 is arranged on a portion corresponding to the third floating diffusion region FD3 in a second direction (Y-direction), and may form a tail part of the T-shape.

Consequently, in the image sensor 100 of an example embodiment, the third floating diffusion region FD3 may be arranged only in the second PD area AR2, and thus, the metal contact may be omitted from the node of the third floating diffusion region FD3, which is a source of the leakage current, and the DSNU and the SNR may be improved. In FIG. 5A, the first PD area AR1 and the second PD area AR2 of the unit pixel PXu have rectangular shapes and are arranged adjacent to each other, but the shape of the unit pixel PXu is not limited thereto. Various shapes of the unit pixel will be described in detail later with reference to FIGS. 7A to 8.

Figure 6:
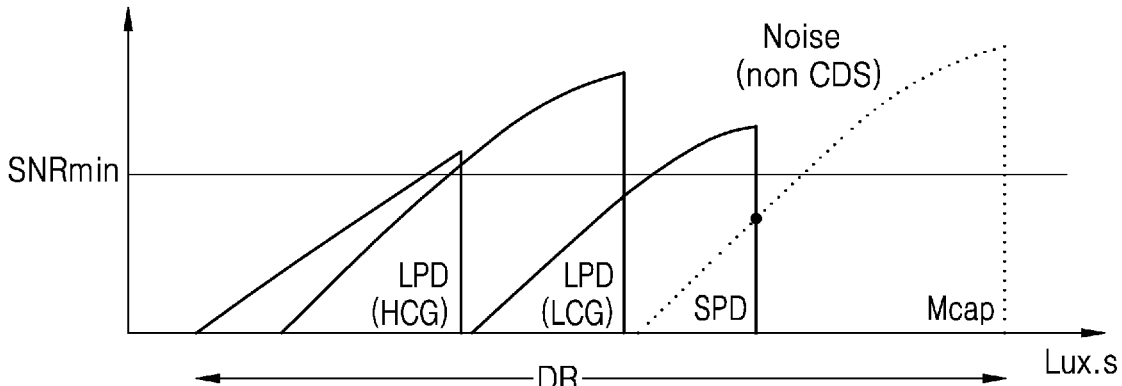
FIG. 6 is a diagram showing signal-to-noise ratio (SNR) graphs about a light intensity in an image sensor having a split PD structure.

FIG. 6 shows SNR graphs about a light intensity in an image sensor having a split PD structure, and in FIG. 6, the X-axis denotes a light intensity lux*see and the Y-axis denotes an SNR.

Referring to FIG. 6, from left to right, graphs corresponding to a high conversion gain (HCG) of the LPD, a low conversion gain (LCG) of the LPD, a conversion gain of the SPD, and a conversion gain of the metal capacitor Mcap are shown. That is, the HCG graph of the LPD at the left side is an SNR graph according to the capacity of the first floating diffusion region FD1, the LCG graph of the LPD that is second from the left side is an SNR graph according to a combined capacity of the first floating diffusion region FD1 and the second floating diffusion region FD2, the conversion gain of the SPD that is third from the left side is an SNR graph according to the capacity of the third floating diffusion region FD3, and the conversion gain of the metal capacitor Mcap at the right side is an SNR graph according to a combined capacity of the third floating diffusion region FD3 and the metal capacitor Mcap.

In addition, when combining modes, issues such as an SNRdip or a minimum threshold value with respect to the SNR (SNRmin) may occur. In this regard, the SNRdip should have a small size, and the SNRmin should be maintained at the high level. As described above, when there is the metal contact on the third floating diffusion region FD3, noise caused therefrom increases and DSNU degrades, and thus, the SNRmin may be greatly decreased. In FIG. 6, in the graphs about the conversion gain of the SPD and the conversion gain of the metal capacitor Mcap, as shown by the black dot, the SNRdip occurs largely and is less than the SNRmin indicated by a straight line.

According to the image sensor 100 of an example embodiment, the metal contact is removed from the third floating diffusion region FD3, and thus, the SDNU degradation and the decrease in the SNRmin may be addressed. For example, in the image sensor 100 of an example embodiment, the SDNU may be improved by about 30% by removing one metal contact from the third floating diffusion region FD3.

Figure 7A:
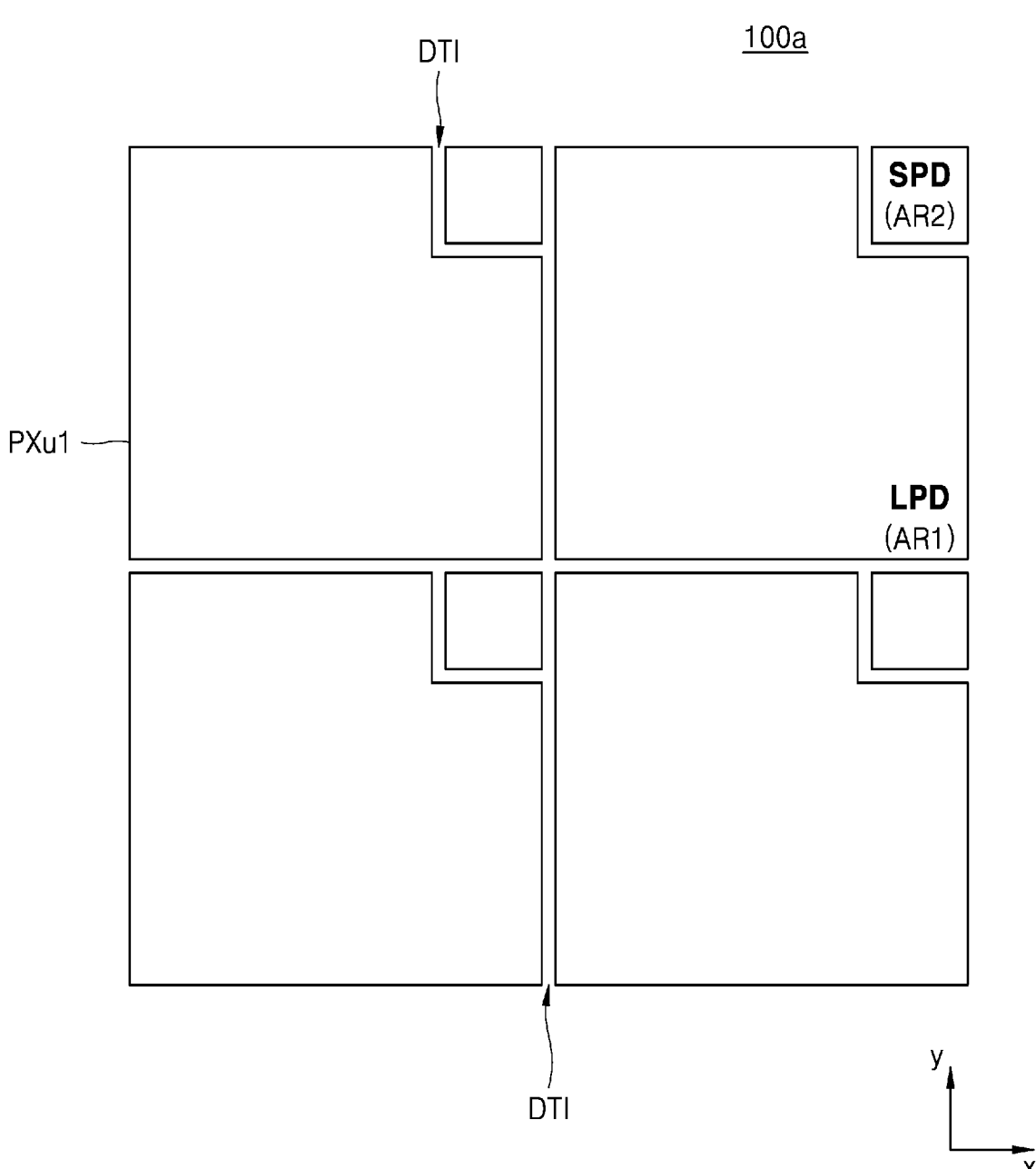
FIGS. 7A, 7B, 7C and 8 are plan views schematically showing a pixel array included in an image sensor according to one or more example embodiments.
Figure 7B:
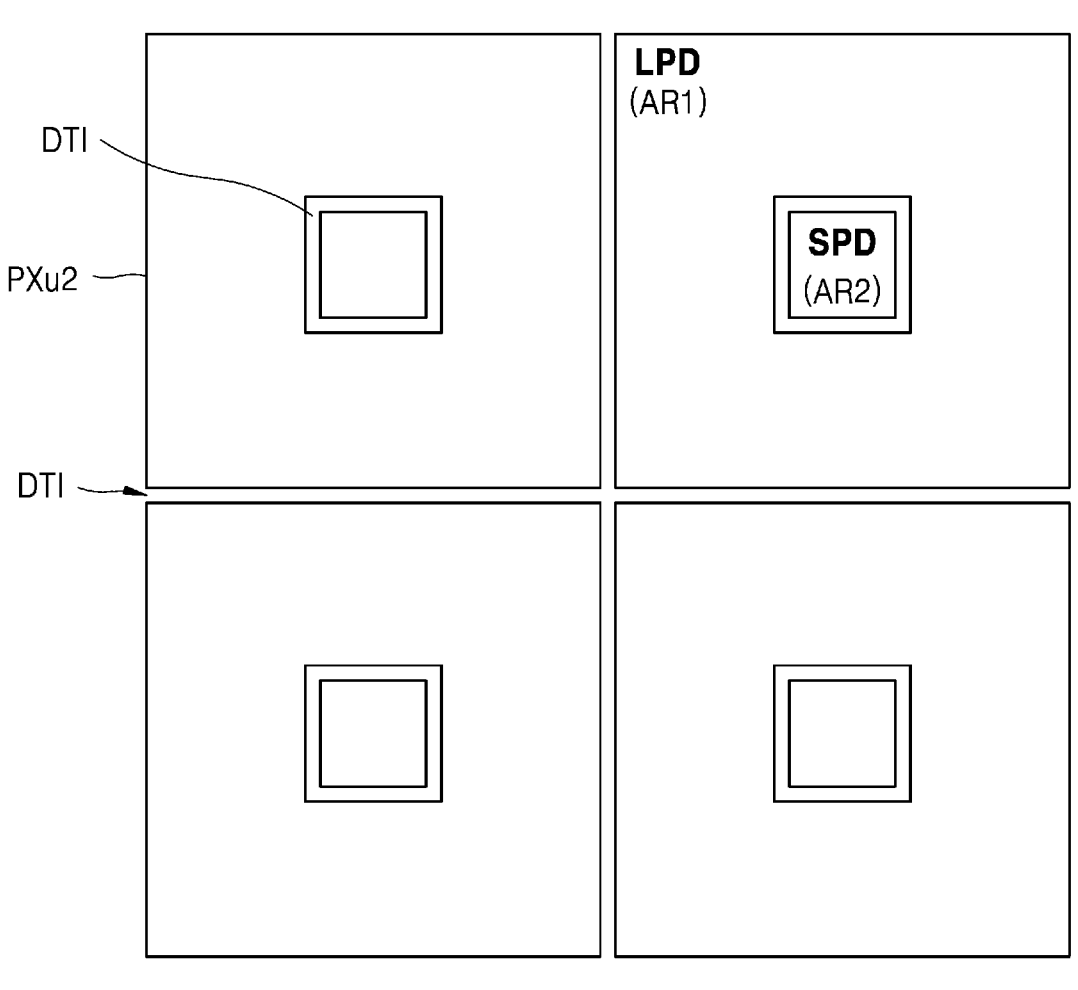
Figure 7B:
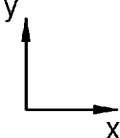
Figure 7C:
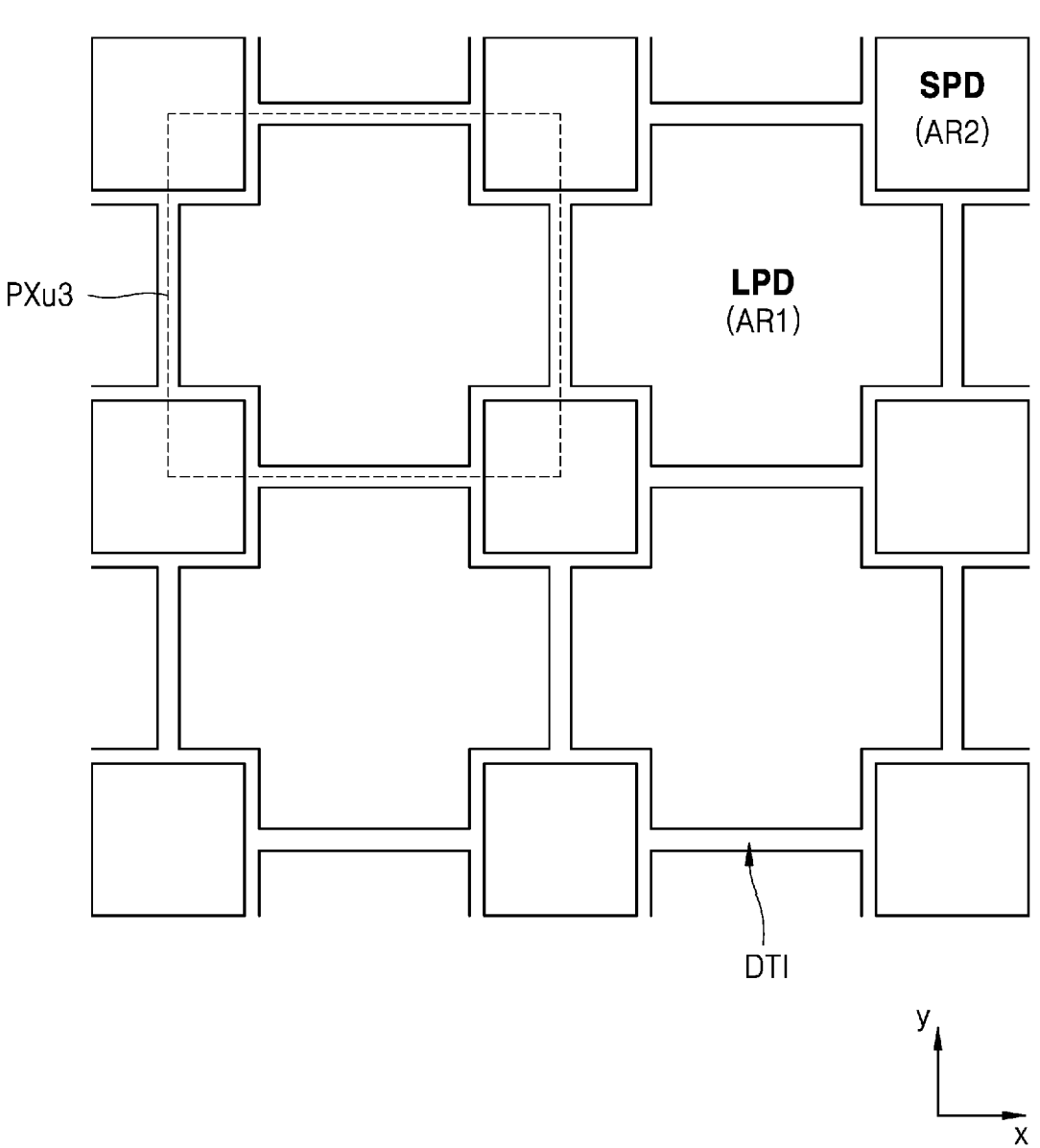
Figure 8:
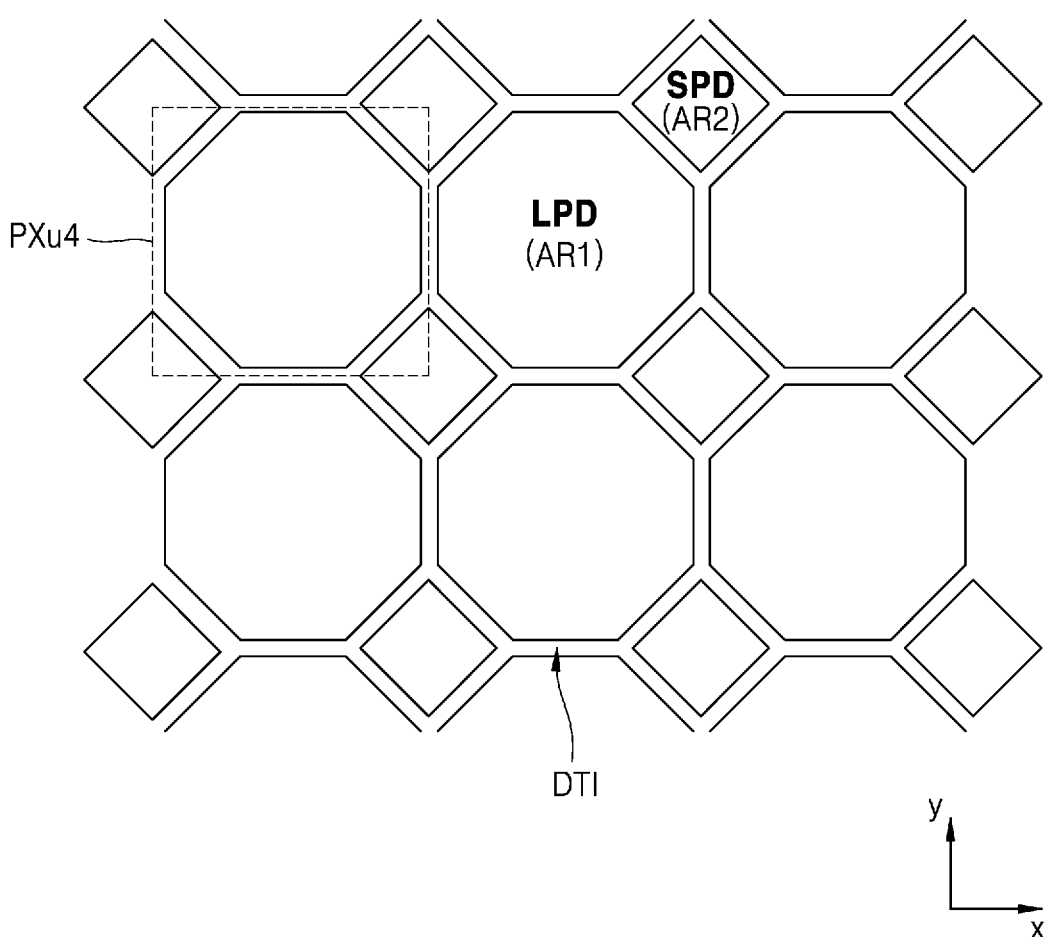

FIGS. 7A to 8 are plan views schematically showing a pixel array included in an image sensor according to one or more example embodiments. Descriptions provided above with reference to FIGS. 1 to 6 will be briefly provided or omitted.

Referring to FIG. 7A, in an image sensor 100a of an example embodiment, the pixels PX (see FIG. 1 or 2) may be arranged in a two-dimensional array structure in the first direction (X-direction) and the second direction (Y-direction). Also, each of the pixels PX may include the first PD area AR1, in which the LPD is arranged, and the second PD area AR2, in which the SPD is arranged. The pixels PX may be separated from one another by the DTI structure. In the image sensor 100a of an example embodiment, the pixels PX may be separated from one another by the DTI, e.g., the FDTI structure.

The first PD area AR1 including the LPD and the second PD area AR2 including the SPD may each have a substantially rectangular shape. The second PD area AR2 may be arranged at an edge portion in the first PD area AR1. A unit pixel PXu1 including the first PD area AR1 and the second PD area AR2 may also have a substantially rectangular shape. Therefore, in more detail, the first PD area AR1 may have a rectangular shape except for the second PD area AR2. As shown in FIG. 7A, the second PD area AR2 may be at an apex of the first PD area AR1, but the location of the second PD area AR2 is not limited thereto. For example, the second PD area AR2 may be arranged at a side of the first PD area AR1. In addition, in the image sensor 100a of an example embodiment, the first PD area AR1 and the second PD area AR2 may be separated from each other by the DTI structure, e.g., the FDTI structure.

Referring to FIG. 7B, in an image sensor 100b of an example embodiment, the pixels PX may be arranged in a two-dimensional array structure in the first direction (X-direction) and the second direction (Y-direction). Also, each of the pixels PX may include the first PD area AR1, in which the LPD is arranged, and the second PD area AR2, in which the SPD is arranged. The pixels PX may be separated from one another by the DTI structure. In the image sensor 100b of an example embodiment, the pixels PX may be separated from one another by the DTI, e.g., the FDTI structure.

The first PD area AR1 including the LPD and the second PD area AR2 including the SPD may each have a substantially rectangular shape. Also, the second PD area AR2 may be arranged at a center of the first PD area AR1. A unit pixel PXu2 including the first PD area AR1 and the second PD area AR2 may also have a substantially rectangular shape. Therefore, in more detail, the first PD area AR1 may have a substantially rectangular loop shape except for the second PD area AR2. As shown in FIG. 7B, the second PD area AR2 may be at the center of the first PD area AR1, but the location of the second PD area AR2 is not limited thereto. For example, the second PD area AR2 may be arranged to be biased toward the edge portion of the first PD area AR1, not in the center portion of the first PD area AR1. In addition, in the image sensor 100b of an example embodiment, the first PD area AR1 and the second PD area AR2 may be separated from each other by the DTI structure, e.g., the FDTI structure.

Referring to FIG. 7C, in an image sensor 100c of an example embodiment, the pixels PX may be arranged in a two-dimensional array structure in the first direction (X-direction) and the second direction (Y-direction). Also, each of the pixels PX may include the first PD area AR1, in which the LPD is arranged, and the second PD area AR2, in which the SPD is arranged. The pixels PX may be separated from one another by the DTI structure. In the image sensor 100c of an example embodiment, the pixels PX may be separated from one another by the FDTI structure.

Figure 9B:
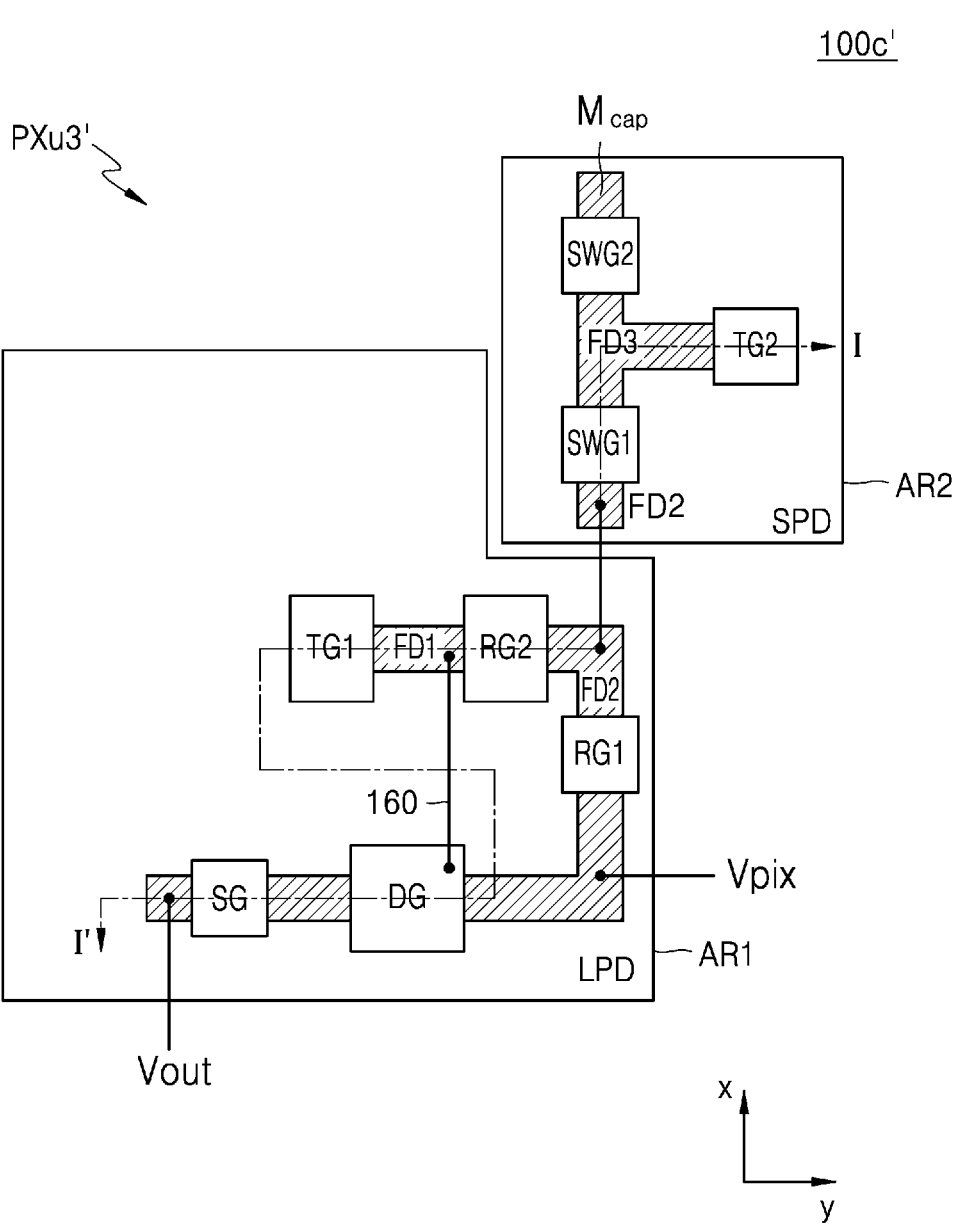

The first PD area AR1 including the LPD and the second PD area AR2 including the SPD may each have a substantially rectangular shape. Unlike in the image sensors 100a and 100b of FIGS. 7A and 7B, the second PD area AR2 may be arranged throughout four adjacent first PD areas AR1. In FIG. 7C, in terms of the two-dimensional array structure including the pixels PX, one unit pixel PXu3 is indicated as a rectangle of dashed lines, which include one first PD area AR1 and parts of four second PD areas AR2. However, in a functional aspect, the unit pixel PXu3 may include one first PD area AR1 and one corresponding second PD area AR2. For example, as shown in FIG. 9B, a unit pixel PXu3' may include one first PD area AR1 and one second PD area AR2 arranged upper right. In more detail, the first PD area AR1 may have a substantially rectangular shape having four apexes, from each of which ¼ of the second PD area AR2 is removed.

As shown in FIG. 7C, the second PD area AR2 may be arranged throughout four adjacent first PD areas AR1, but the location of the second PD area AR2 is not limited thereto. For example, the second PD area AR2 may be arranged throughout two adjacent first PD areas AR1. In the above structure, the second PD areas AR2 may be arranged on two sides facing each other and may not be arranged on the other two sides facing each other. This is because the unit pixel PXu3 has to include one first PD area AR1 and one second PD area AR2. In addition, in the image sensor 100c of an example embodiment, the first PD area AR1 and the second PD area AR2 may be separated from each other by the DTI structure, e.g., the FDTI structure.

Referring to FIG. 8, in an image sensor 100d of an example embodiment, the pixels PX may be arranged in a two-dimensional array structure in the first direction (X-direction) and the second direction (Y-direction). Also, each of the pixels PX may include the first PD area AR1, in which the LPD is arranged, and the second PD area AR2, in which the SPD is arranged. The pixels PX may be separated from one another by the DTI structure. In the image sensor 100d of an example embodiment, the pixels PX may be separated from one another by the DTI, e.g., the FDTI structure.

In the image sensor 100d of an example embodiment, the first PD area AR1 including the LPD may have an octagonal shape, and the second PD area AR2 including the SPD may have a substantially rectangular shape. In addition, the second PD area AR2 may be arranged among four adjacent first PD areas AR1, similar to the image sensor 100c of FIG. 7C. In more detail, one second PD area AR2 may be surrounded by four first PD areas AR1. Also, four second PD areas AR2 may be arranged adjacent to four sides from among the eight sides of the first PD area AR1.

In FIG. 8, in terms of the two-dimensional array structure including the pixels PX, one unit pixel PXu4 is indicated as a rectangle of dashed lines, which include one first PD area AR1 and parts of four second PD areas AR2. However, in a functional aspect, the unit pixel PXu4 may include one first PD area AR1 and one corresponding second PD area AR2. For example, the unit pixel PXu4 may include one first PD area AR1 and one second PD area AR2 arranged upper right. In addition, in the image sensor 100d of an example embodiment, the first PD area AR1 and the second PD area AR2 may be separated from each other by the DTI structure, e.g., the FDTI structure.

Example embodiments in which the first PD area AR1 of the LPD has the rectangular or octagonal shape and the second PD area AR2 of the SPD has the rectangular shape are described above. However, the shapes of the first PD area AR1 and the second PD area AR2 included in each pixel PX are not limited to the above shapes. For example, the first PD area AR1 may have a hexagonal shape. In addition, the second PD area AR2 may generally have a substantially rectangular shape. However, when the second PD area AR2 is arranged in the first PD area AR1, the second PD area AR2 may have various shapes, e.g., a circular shape, an elliptical shape, a polygonal shape rather than the rectangular shape, etc.

FIGS. 9A and 9B are plan views showing positions of transistors, floating diffusion regions, and switches in a unit pixel of the image sensor of FIG. 7C, and FIG. 10 is a cross-sectional view taken along line I-I' of FIG. 9B.

Referring to FIG. 9A, in the image sensor 100c of an example embodiment, the unit pixel PXu3 may include the first PD area AR1 including the LPD and the second PD area AR2 including the SPD. As described above, the first PD area AR1 and the second PD area AR2 may be separated from each other by the DTI structure, e.g., the FDTI structure. As described above with reference to FIG. 7C, the first PD area AR1 and the second PD area AR2 may each have a substantially rectangular shape, and the second PD area AR2 may be arranged throughout four adjacent first PD areas AR1.

The first PD area AR1 may include a first transfer transistor TX1, a first reset transistor RX1, a second reset transistor RX2, a driving transistor DX, and a select transistor SX. Also, the first floating diffusion region FD1 and the second floating diffusion region FD2 may be arranged in the first PD area AR1. In addition, regarding the circuit connecting relationship, the second floating diffusion region FD2 may be connected to the second floating diffusion region FD2 of the second PD area AR2 via the metal contact, on the basis of the circuit diagram shown in FIG. 4. Also, the first floating diffusion region FD1 may be connected to a gate DG of the driving transistor DX, and a power voltage Vpix may be connected to the sources of the first reset transistor RX1 and the driving transistor DX. A column line may be connected to a drain of the select transistor SX to output a voltage Vout.

In addition, in the first PD area AR1, TG1 corresponds to a gate of the first transfer transistor TX1, RG1 and RG2 correspond to gates of the first reset transistor RX1 and the second reset transistor RX2, DG corresponds to a gate of the driving transistor DX, and SG corresponds to a gate of the select transistor SX. Also, in the first PD area AR1, hatched portions denote high-concentration doping regions, which may configure the first floating diffusion region FD1, the second floating diffusion region FD2, or source/drain regions of the pixel transistor.

The structure of the pixel circuits arranged in the second PD area AR2 is the same as the above description with reference to FIG. 5A. However, the first direction (X-direction) and the second direction (Y-direction) in FIG. 9A may correspond to a state in which the first direction (X-direction) and the second direction (Y-direction) of FIG. 5A are rotated by 90°. Therefore, in the image sensor 100c of an example embodiment, the third floating diffusion region FD3 is arranged only in the second PD area AR2 of the SPD, and the first switch SW1 may be also arranged only in the second PD area AR2. Therefore, the metal contact is not arranged on the third floating diffusion region FD3, and thus, the DSNU and the SNR may be improved.

Referring to FIGS. 9B and 10, in an image sensor 100c' of an example embodiment, a unit pixel PXu3' may include the first PD area AR1 including the LPD and the second PD area AR2 including the SPD. The first PD area AR1 and the second PD area AR2 may be separated from each other by the DTI structure, e.g., the FDTI structure. The shapes of the first PD area AR1 and the second PD area AR2 may be substantially the same as the shapes of the first PD area AR1 and the second PD area AR2 in the unit pixel PXu3 of the image sensor 100c shown in FIG. 9A.

In addition, regarding the pixel circuit, the pixel circuit of the second PD area AR2 may have substantially the same structure as that of the pixel circuit of the second PD area AR2 in the image sensor 100c of FIG. 9A. However, the pixel circuit in the first PD area AR1 may have a different structure from that of the first PD area AR1 in the image sensor 100c of FIG. 9A. In detail, in the image sensor 100c of FIG. 9A, the driving transistor DX and the select TF SX are arranged on the central portion of the first PD area AR1, the first transfer transistor TX1 and the second reset transistor RX2 may be arranged on a lower end portion of the first PD area AR1, and the first reset transistor RX1 may be arranged on a right edge portion of the first PD area AR1 to be adjacent to the second PD area AR2. Also, the high-concentration doping regions indicated by hatches may be arranged separately from each other.

On the contrary, in the image sensor 100c' of an example embodiment, the first transfer transistor RX1 and the second reset transistor RX2 may be arranged on the central portion of the first PD area AR1, and the driving transistor DX and the select transistor SX may be arranged on a lower end portion of the first PD area AR1. Also, the first reset transistor RX1 may be arranged on the right edge portion of the first PD area AR1 to be adjacent to the second PD area AR2. The high-concentration doping regions may be connected to one another. In some example embodiments, the high-concentration doping regions may be separated from one another. In addition, based on the circuit diagram of FIG. 4, the circuit connection relationship in the image sensor 100c' of an example embodiment may be substantially the same as that of the image sensor 100c of FIG. 9A.

Referring to FIG. 10, when a vertical structure of the image sensor 100c' of an example embodiment is described, the first PD area AR1 and the second PD area AR2 may be defined on a substrate 101. The substrate 101 may include silicon. However, the material included in the substrate 101 is not limited to silicon. For example, the substrate 101 may include a single semiconductor element, such as germanium (Ge), or a compound semiconductor, such as silicon carbide (SiC), gallium arsenide (GaAs), indium arsenide (InAs), or indium phosphite (InP).

A color filter 170 and a micro-lens 180 may be arranged on the lower surface of the substrate 101. The color filter 170 may be separated by a metal grating 172. The metal grating 172 may include, for example, tungsten (W). However, the material included in the metal grating 172 is not limited to W. The image sensor 100c' of an example embodiment may include a back side illumination (BSI) structure, in which the color filter 170 and the micro-lens 180 are arranged opposite to the pixel circuit and a wiring layer based on the substrate 101. Accordingly, the light may be incident on the lower surface of the substrate 101. In addition, a structure in which a color filter and a micro-lens are formed in the same direction as the pixel circuit and the wiring layer based on the substrate 101, that is, the color filter and the micro-lens are arranged on the wiring layer, is referred to as a front side illumination (FSI) structure.

In the substrate 101 an LPD 110L may be arranged in the first PD area AR1, and an SPD 110S may be arranged in the second PD area AR2. The LPD 110L and the SPD 110S may occupy most of the substrate 101, except for an upper portion of the substrate 101 in a vertical direction. Here, the vertical direction may denote a direction perpendicular to the upper or lower surface of the substrate 101. In addition, the first PD area AR1 and the second PD area AR2 may be separated from each other by a DTI 130.

The DTI 130 may have a structure passing through the substrate 101 in the vertical direction. Because the DTI 130 has a structure passing through the substrate 101, cross-talk caused by the light that is obliquely incident to the substrate 101 may be prevented. Also, the LPD 110L and the SPD 110S may be formed adjacent to the DTI 130, and accordingly, a light-receiving area may be increased and a fill factor may be improved.

The DTI 130 may include a conductive layer 132 and an insulation layer 134.

The conductive layer 132 may include, for example, polysilicon or polysilicon doped with impurities. However, the material of the conductive layer 132 is not limited to the above examples. For example, the conductive layer 132 may include metal, metal silicide, a metal-containing conductive material, etc. The insulation layer 134 may surround an outer portion of the conductive layer 132 and may insulate the conductive layer 132 from the substrate 101. The insulation layer 134 may include, for example, an oxide material or a nitride material, such as silicon oxide, silicon nitride, silicon oxynitride, etc. However, the material of the insulation layer 134 is not limited to the above examples.

The pixel circuits may be arranged on an upper portion of the substrate 101. FIG. 10 only shows the pixel circuits that are exposed along line I-I' of FIG. 9B, and the other pixel circuits not shown in the drawing may be arranged inside or outside in the direction perpendicular to a paper plane. The pixel circuits shown in FIG. 10 may include the first transfer transistor TX1, the second reset transistor RX2, the driving transistor DX, and the select transistor SX that may be arranged on the upper portion of the substrate 101 in the first PD area AR1.

A gate TG1, of the first transfer transistor TX1 may have a vertical structure 150V. Accordingly, the gate TG1 of the first transfer transistor TX1 may extend to pass through the upper portion of the substrate 101 in the vertical direction and may be connected to the LPD 110L. The gate TG1 of the first transfer transistor TX1 may include, for example, a conductive material, such as doped silicon.

A gate RG2, of the second reset transistor RX2, a gate DG of the driving transistor DX, and a gate SG of the select transistor SX may have horizontal structures 150S. Accordingly, the gates RG2, DG, SG in the horizontal structures 150S may be arranged on the upper surface of the substrate 101.

High-concentration doping regions 140 may be arranged in parts of the upper surface of the substrate 101 and may form the first floating diffusion region FD1, the second floating diffusion region FD2, and source/drain regions of the pixel transistors. For example, the high-concentration doping region 140 between the gate TG1 of the first transfer transistor TX1 and a gate RG2 of the second reset transistor RX2 may form the first floating diffusion region FD1. Also, the high-concentration doping region 140 at the side of the gate RG2 of the second reset transistor RX2, which is opposite to the first floating diffusion region FD1, may form the second floating diffusion region FD2. In addition, the high-concentration doping regions 140 at opposite sides of the gate DG of the driving TF DX and of the gate SG of the select transistor SX may form the source/drain regions of the driving transistor DX and the select transistor SX.

A potential barrier layer (PBL) 120 may be formed in the upper portion of the substrate 101 above the LPD 110L. The PBL 120 may correspond to a p-type doped region. The high-concentration doping region 140 may include an n-type doped region. As shown in FIG. 10, the gate TG1 of the first transfer transistor TX1 may pass through the PBL 120 and may be connected to the large PD 110L. A p-type well 103 may be arranged on the upper portion of the substrate 101 above the potential barrier layer 120.

The second transfer transistor TX2 and the first switch SW1 may be arranged on the upper portion of the substrate 101 in the second PD area AR2. The gate TG2 of the second transfer transistor TX2 may have a vertical structure 150V. Accordingly, the gate TG2 of the second transfer transistor TX2 may extend to pass through the upper portion of the substrate 101 in the vertical direction and may be connected to the small PD 110S. The gate TG2 of the second transfer transistor TX2 may include, for example, a conductive material, such as doped silicon. A gate SWG1 of the first switch SW1 may have a horizontal structure 150S. Accordingly, the gate SWG1 of the horizontal structure 150S may be arranged on the upper surface of the substrate 101.

In addition, the high-concentration doping regions 140 may be arranged in parts of the upper surface of the substrate and may form the second floating diffusion region FD2 and the third floating diffusion region FD3. For example, the high-concentration doping region 140 between the gate SWG1 of the first switch SW1 and the gate TG2 of the second transfer transistor TX2 may form the third floating diffusion region FD3. Also, the high-concentration doping region 140 at the side of the gate SWG1 of the first switch SW1, which is opposite to the third floating diffusion region FD3, may form the second floating diffusion region FD2.

The PBL 120 may be formed in the upper portion of the substrate 101 above the small PD 110S. The PBL 120 may correspond to a p-type doped region. As shown in FIG. 10, the gate TG2 of the second transfer transistor TX2 may pass through the PBL 120 and may be connected to the small PD 110S.

In addition, corresponding to the connecting relationship between the pixel circuits shown in FIG. 9B, the second floating diffusion region FD2 of the first PD area AR1 and the second floating diffusion region FD2 of the second PD area AR2 may be connected via a wiring layer 160. Also, in the first PD area AR1, the first floating diffusion region FD1 may be connected to the gate DG of the driving transistor DX via the wiring layer 160. The wiring layer 160 may include a metal contact. In addition, the power voltage Vpix is connected to the source of the driving transistor DX in the first PD area AR1 via the wiring layer 160, and the column line may be connected to the drain of the select transistor SX to output the voltage Vout.

While aspects of example embodiments have been particularly shown and described, it will be understood that various changes in form and details may be made therein without departing from the spirit and scope of the following claims.

What is claimed is:

1. An image sensor comprising:
a first photodiode (PD) provided in a first area;
a second PD provided in a second area, wherein the second area is smaller than the first area, and the second area is adjacent to the first area;
a first floating diffusion region that is provided in the first area and connected to the first PD via a first transfer transistor;
a second floating diffusion region that is connected to a power source via a first reset transistor and the first floating diffusion region via a second reset transistor;
a third floating diffusion region that is provided in the second area, and is connected to the second PD via a second transfer transistor and the second floating diffusion region via a first switch; and
a capacitor connected between the third floating diffusion region and the power source,
wherein the first reset transistor and the second reset transistor are provided in the first area, and
wherein the first PD and the second PD form one pixel, and the first switch is provided in the second area.

2. The image sensor of claim 1, further comprising a second switch provided between the capacitor and the third floating diffusion region.

3. The image sensor of claim 2, wherein, in the second area, the second transfer transistor, the first switch, and the second switch are arranged in a planar T-shape about the third floating diffusion region.

4. The image sensor of claim 3, wherein the second floating diffusion region, the first switch, the third floating diffusion region, the second switch, and the capacitor are arranged in a first direction and form a head of the planar T-shape, and
wherein the second transfer transistor is provided at a location corresponding to the third floating diffusion region in a second direction that is perpendicular to the first direction, and forms a tail part of the planar T-shape.

5. The image sensor of claim 1, wherein the third floating diffusion region has no metal contact.

6. The image sensor of claim 1, wherein the first area and the second area are isolated from each other by a deep trench isolation (DTI), and wherein a first portion of the second floating diffusion region is provided in the first area, and a second portion of the second floating diffusion region is provided in the second area and is connected to the first portion via a wiring layer.

7. The image sensor of claim 1, wherein the first transfer transistor has a vertical structure and is connected to the first PD, and wherein the second transfer transistor has a vertical structure and is connected to the second PD.

8. The image sensor of claim 7, wherein a potential barrier layer is provided on the first PD and the second PD, and wherein the first transfer transistor and the second transfer transistor are respectively connected to the first PD and the second PD through the potential barrier layer.

9. The image sensor of claim 1, wherein the one pixel is one of a plurality of pixels arranged in a two-dimensional array, wherein the first area and the second area each have a planar rectangular shape, and wherein the second area is provided at a center of the first area, an outer edge of the first area or between a plurality of adjacent first areas.

10. The image sensor of claim 1, wherein the one pixel is one of a plurality of pixels arranged in a two-dimensional array, wherein the first area has an octagonal shape and the second area has a rectangular shape, and wherein the second area is one of four second areas that are alternately provided on four sides from among eight sides of the first area.

11. An image sensor comprising:

a substrate having a first area and a second area;

a first photodiode (PD) provided in the first area of the substrate;

a second PD that is smaller than the first PD, and is provided in the second area of the substrate;

a first floating diffusion region that is provided on an upper portion of the first PD and is connected to the first PD via a first transfer transistor;

second floating diffusion regions that are provided on the upper portion of the first PD in the first area and an upper portion of the second PD in the second area, and connected to a power source via a first reset transistor and the first floating diffusion region via a second reset transistor;

a third floating diffusion region which is provided on the upper portion of the second PD, and connected to the second PD via a second transfer transistor and the second floating diffusion regions via a first switch;

a capacitor provided on the upper portion of the second PD, and connected between the third floating diffusion region and the power source; and a color filter and a micro-lens that are provided on lower portions of the first area and the second area, wherein the first reset transistor and the second reset transistor are provided in the first area, and wherein a deep trench isolation (DTI) extends through the substrate between the first area and the second area, the first PD and the second PD form one pixel, and the first switch is provided between the second floating diffusion regions and the third floating diffusion region.

12. The image sensor of claim 11, further comprising a second switch provided between the capacitor and the third floating diffusion region, wherein, in the second area, the second transfer transistor, the first switch, and the second switch are provided in a planar T-shape about the third floating diffusion region.

13. The image sensor of claim 11, wherein the second floating diffusion regions in the first area and the second area are connected to each other via a wiring layer.

14. The image sensor of claim 11, wherein a potential barrier layer is provided on the upper portion of the first PD and the upper portion the second PD, and wherein the first transfer transistor and the second transfer transistor have vertical structures and are respectively connected to the first PD and the second PD through the potential barrier layer.

15. The image sensor of claim 11, wherein the one pixel is one of a plurality of pixels arranged in a two-dimensional array structure, wherein the first area and the second area each have a planar rectangular shape, and wherein the second area is provided at a center of the first area, an outer edge portion of the first area or provided between a plurality of adjacent first areas.

16. An image sensor comprising:

a first photodiode (PD) provided in a first area;

a second PD provided in a second area that is smaller than the first area and is adjacent to the first area;

a first floating diffusion region provided in the first area;

a second floating diffusion region provided in each of the first area and the second area;

a third floating diffusion region provided in the second area;

a first transfer transistor provided between the first PD and the first floating diffusion region;

a second transfer transistor provided between the second PD and the third floating diffusion region;

a first reset transistor provided between the second floating diffusion region and a power source;

a second reset transistor provided between the first floating diffusion region and the second floating diffusion region;

a first switch provided between the third floating diffusion region and the second floating diffusion region in the second area; and a capacitor provided between the third floating diffusion region and the power source in the second area, wherein the first reset transistor and the second reset transistor are provided in the first area, and wherein the first PD and the second PD form one pixel, and a deep trench isolation (DTI) extends between the first area and the second area.

17. The image sensor of claim 16, further comprising a second switch provided between the capacitor and the third floating diffusion region, wherein, in the second area, the second transfer transistor, the first switch, and the second switch are provided in a planar T-shape about the third floating diffusion region.

18. The image sensor of claim 16, wherein the second floating diffusion region in the first area and the second floating diffusion region in the second area are connected to each other via a wiring layer, and wherein the third floating diffusion region has no metal contact.

19. The image sensor of claim 16, wherein the one pixel is one of a plurality of pixels arranged in a two-dimensional array, wherein the first area and the second area each have a planar rectangular shape, and wherein the second area is provided at a center of the first area, or an outer edge portion of the first area or between a plurality of adjacent first areas.

20. The image sensor of claim 16, wherein the one pixel is one of a plurality of pixels provided in a two-dimensional array, wherein the first area has an octagonal shape and the second area has a rectangular shape, and wherein the second area is one of four second areas that are alternately provided on four sides from among eight sides of the first area.

* * * * *